US006559469B1

(12) United States Patent
Paz de Araujo et al.

(10) Patent No.: US 6,559,469 B1
(45) Date of Patent: May 6, 2003

(54) FERROELECTRIC AND HIGH DIELECTRIC CONSTANT TRANSISTORS

(75) Inventors: Carlos A. Paz de Araujo, Colorado Springs, CO (US); Larry D. McMillan, Colorado Springs, CO (US); Vikram Joshi, Colorado Springs, CO (US); Narayan Solayappan, Colorado Springs, CO (US); Joseph D. Cuchiaro, Colorado Springs, CO (US)

(73) Assignee: Symetrix Corporation, Colorado Springs, CO (US)

( * ) Notice: Subject to any disclaimer, the term of this patent is extended or adjusted under 35 U.S.C. 154(b) by 96 days.

(21) Appl. No.: 09/686,552

(22) Filed: Oct. 11, 2000

(Under 37 CFR 1.47)

Related U.S. Application Data

(63) Continuation-in-part of application No. 09/385,308, filed on Aug. 30, 1999, and a continuation-in-part of application No. 08/405,885, filed on Mar. 17, 1995, now Pat. No. 6,133,050, which is a continuation-in-part of application No. 08/224,241, filed on Apr. 7, 1994, now Pat. No. 5,523,964, and a continuation-in-part of application No. 07/965,190, filed on Oct. 23, 1992, now abandoned.

(51) Int. Cl.$^7$ .............................................. H01L 29/72
(52) U.S. Cl. ............................. 257/15; 257/16; 257/17; 257/18; 257/19; 257/20; 257/21; 257/22; 257/295
(58) Field of Search ............................. 257/15, 16, 17, 257/18, 19, 20, 21, 22, 295

(56) References Cited

U.S. PATENT DOCUMENTS

| 5,155,566 A | * 10/1992 | Nakayama et al. ......... 257/295 |
| 5,434,102 A | 7/1995 | Watanabe et al. |
| 5,519,234 A | 5/1996 | Paz de Araujo et al. |
| 5,523,964 A | 6/1996 | McMillan et al. |
| 5,784,310 A | 7/1998 | Cuchiaro et al. |
| 5,840,110 A | 11/1998 | Azuma et al. |
| 6,133,050 A | 7/2000 | Paz de Araujo et al. |

FOREIGN PATENT DOCUMENTS

EP 0489519 7/1992

OTHER PUBLICATIONS

Wu, Shu–Yau, "A New Ferroelectric Memory Device, Metal–Ferroelectric–Semiconductor Transistor", IEEE Transactions On Electron Devices, pp. 499–504 (Aug., 1974).

Wu, S.Y., "Memory Retention and Switching Behavior Of Metal–Ferroelectric–Semiconductor Transistors", Ferroelectrics, vol. 11, pp. 379–383 (1976).

(List continued on next page.)

Primary Examiner—Edward Wojciechowicz
(74) Attorney, Agent, or Firm—Patton Boggs LLP

(57) ABSTRACT

An integrated circuit includes a layered superlattice material having the formula $A1_{w1}^{+a1} A2_{w2}^{+a2} \ldots Aj_{wj}^{+aj} S1_{x1}^{+s1} S2_{x2}^{+s2} \ldots Sk_{xk}^{+sk} B1_{y1}^{+b1} B2_{y2}^{+b2} \ldots Bl_{yl}^{+bl} Q_z^{-q}$, where A1, A2 . . . Aj represent A-site elements in a perovskite-like structure, S1, S2 . . . Sk represent superlattice generator elements, B1, B2 . . . Bl represent B-site elements in a perovskite-like structure, Q represents an anion, the superscripts indicate the valences of the respective elements, the subscripts indicate the number of atoms of the element in the unit cell, and at least w1 and y1 are non-zero. Some of these materials are extremely low fatigue ferroelectrics and are applied in ferroelectric FETs in non-volatile memories. Others are high dielectric constant materials that do not degrade or break down over long periods of use and are applied as the gate insulator in volatile memories.

53 Claims, 6 Drawing Sheets

OTHER PUBLICATIONS

Lines, M.E. et al., Principles and Applications of Ferroelectrics And Related Materials, Clarendon Press, Oxford, Chapter 8, pp. 241–291, and Appendix F, pp. 624–625 (1977).

Smolenskii, G.A., Ferroelectrics and Related Materials, ISSN 0275–9608 (V. 3 of the series Ferroelectrics and Related Phenomena), Sections 15.3–15.7 (1984).

Smolenskii, G.A., et al., "Dielectric Polarization of a Number of Complex Compounds", Fizika Tverdogo Tela, V. 1, No. 10, pp. 1562–1572 (Oct., 1959).

Smolenskii, G.A., et al. "New Ferroelectrics of Complex Composition", Soviet Physics—Technical Physics, pp. 907–908 (1959).

Smolenskii, G.A., et al. "Ferroelectrics of the Oxygen–Octahedral Type With Layered Structure", Soviet Physics—Solid States, V. 3, No. 3, pp. 651–655 (Sep., 1961).

Subbarao, E.C., "Ferroelectricity in Mixed Bismuth Oxides With Layer–Type Structure", J. Chem. Physics, V. 34, pp. 695 (1961).

Subbarao, E.C., "A Family of Ferroelectric Bismuth Compounds", J. Phys. Chem. Solids, V. 23, pp. 665–676 (1962).

Smolenskii et al, Soviet Physics—Solid State, vol. 3, No. 3, Sep. 1961.*

* cited by examiner

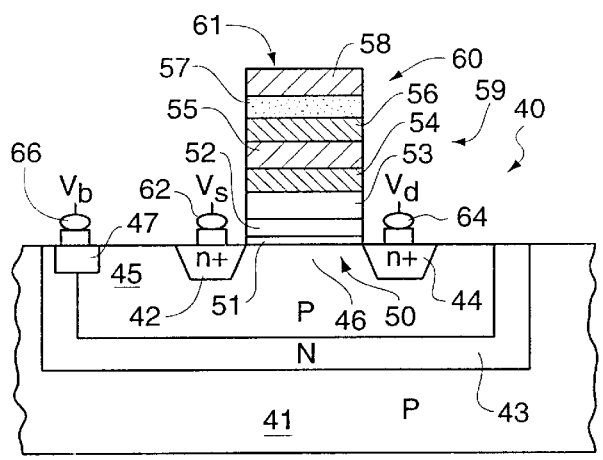
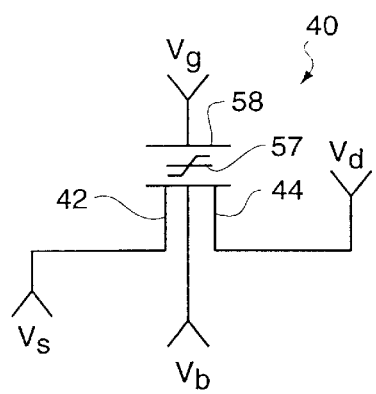
FIG. 1  FIG. 2
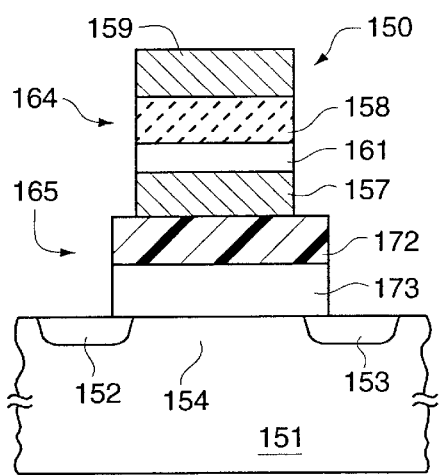
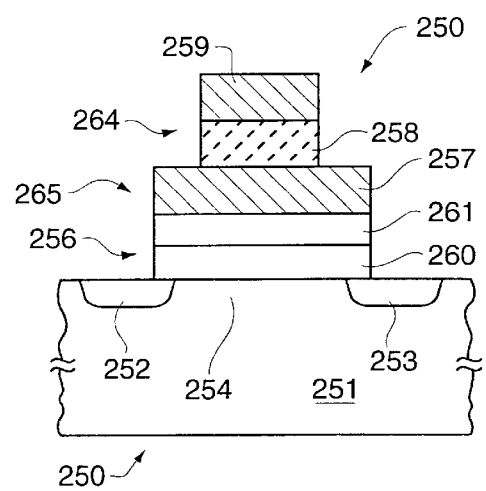
FIG. 3  FIG. 4

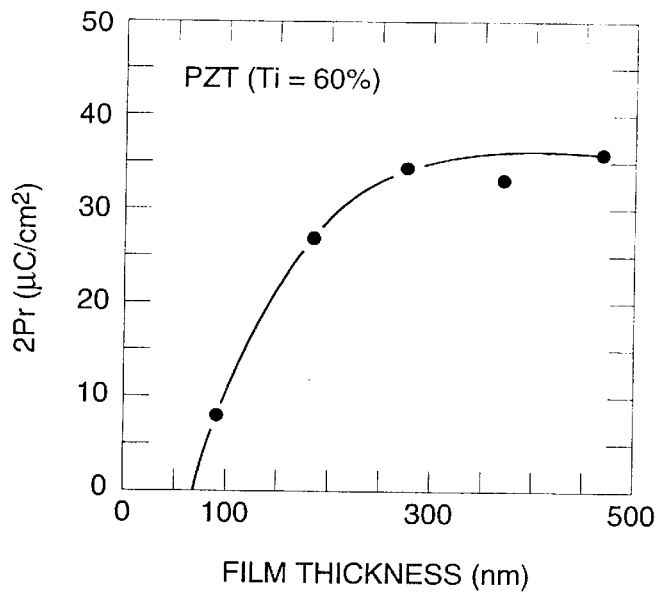
FIG. 12
PRIOR ART
FIG. 13
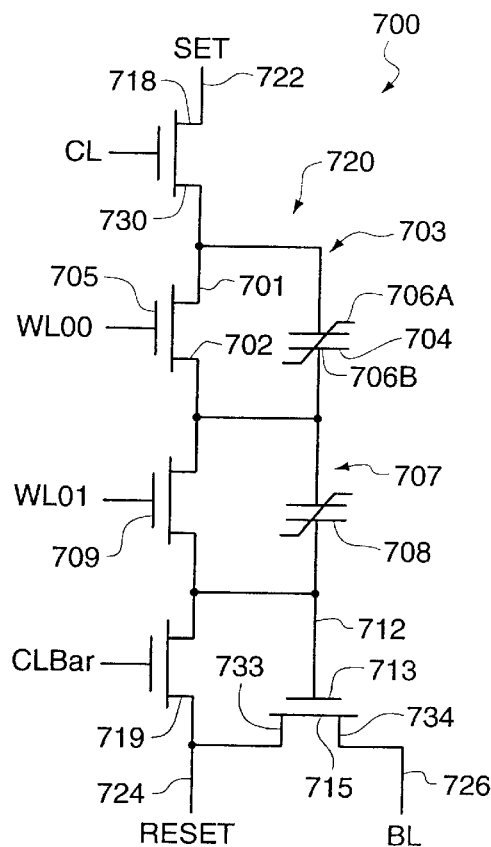

FERROELECTRIC AND HIGH DIELECTRIC CONSTANT TRANSISTORS

RELATED APPLICATIONS

This application is a continuation-in-part of U.S. patent application Ser. No. 08/405,885 filed Mar. 17, 1995, now U.S. Pat. No. 6,133,050 which itself is a continuation-in-part of U.S. patent application Ser. No. 08/224,241 filed Apr. 7, 1994, now U.S. Pat. No. 5,523,964 issued Jun. 4, 1996, and is also a continuation-in-part of U.S. patent application Ser. No. 07/965,190 filed Oct. 23, 1992, now abandoned. This is also a continuation-in-part of U.S. patent application Ser. No. 09/385,308 filed Aug. 30, 1999. The above applications and patent and U.S. patent application Ser. No. 08/477,331 filed Jun. 7, 1995, now U.S. Pat. No. 6,056,994, are incorporated by reference to the same extent as though fully disclosed herein.

BACKGROUND OF THE INVENTION

1. Field of the Invention

This invention relates to ferroelectric and high dielectric transistors, and more particularly to such transistors utilizing layered superlattice materials and tantalum oxide materials.

2. Statement of the Problem

It has been postulated for at least 40 years that it may be possible to design a memory in which the memory element is a ferroelectric field effect transistor (FET). See Shu-Yau Wu, "A New Ferroelectric Memory Device, Metal-Ferroelectric-Semiconductor Transistor", *IEEE Transactions On Electron Devices*, pp. 499–504, August 1974; and S.Y. Wu, "Memory Retention and Switching Behavior Of Metal-Ferroelectric-Semiconductor Transistors", *Ferroelectrics*, Vol. 11, pp. 379–383, 1976. Because the ferroelectric effect measured in the early devices of Wu was only a temporary, single state effect rather than a long lived two-state effect, it is now believed that this effect was charge injection effect rather than an effect due to ferroelectric switching. Moreover, the polarizability of the bismuth titanate thin films made by Wu had a polarizability of only 4 microcoulombs per centimeter squared ($\mu C/cm^2$). This is much too low to make an effective memory. See European Patent application 0489519 A2 published Jul. 6, 1992, page 2, lines, 4–6. The polarizability of bismuth titanate was known at that time to be far higher than any other layered superlattice material. See M. E. Lines and A. M. Glass, *Principles and Applications of Ferroelectrics And Related Materials*, Clarendon Press, Oxford, 1977, Appendix F, pp. 624 and 625. As a result, no one ever again attempted to use a layered superlattice material in an actual memory utilizing a ferroelectric FET as the memory element. In fact, at the present time, no commercial memory in which the memory element is a ferroelectric FET has yet been made. Because such a memory, if feasible, would be non-volatile, dense, and faster than any present non-volatile memory now available, it would be highly desirable if a ferroelectric memory utilizing a ferroelectric memory element were available.

If a commercially useful ferroelectric FET could be made, a similar FET could be useful as a switching element in other electronic devices also, such as a select transistor in a DRAM or FERAM.

SUMMARY OF THE INVENTION

The invention solves the above problem by providing a transistor including a layered superlattice material. Preferably, the charge storage element of the transistor comprises a layered superlattice material.

In one embodiment, the invention provides a ferroelectric FET in which the charge storage element is a ferroelectric layered superlattice material. The ferroelectric FET may be a MFMISFET (metal/ferroelectric/metal/insulator/semiconductor FET), a MFSFET (metal/ferroelectric/semiconductor FET), or any other form of ferroelectric FET. As known in the art, the term "metal" in the names for the above FETs does not mean that a metal must be used for the layer indicated by "metal", but only that the layer must be conductive. For example, polysilicon is often used as the "metal" in such FETs.

In another embodiment, the invention provides a field effect transistor in which the charge storage element is a non-ferroelectric high dielectric constant layered superlattice material. The field effect transistor is preferably the select transistor in a memory cell, which is preferably a DRAM or an FERAM.

The invention not only provides a ferroelectric memory in which the memory cell is a ferroelectric FET and which demonstratably works, but also provides one that is dense, and manufacturable. It also provides a select transistor for a DRAM or FERAM having a high dielectric constant storage insulator. A device in accordance with the invention preferably includes an interface insulator located between the channel and the layered superlattice material of a FET. Other features, objects and advantages of the invention will become apparent from the following description when read in conjunction with the accompanying drawings.

BRIEF DESCRIPTION OF THE DRAWINGS

FIG. 1 shows a cross-sectional view of a preferred embodiment of a ferroelectric FET in accordance with the invention;

FIG. 2 is an equivalent circuit diagram of the ferroelectric FET of FIG. 1;

FIGS. 3–6 illustrate various embodiments of the gate structure of a ferroelectric FET in accordance with the invention;

FIG. 12 shows a graph of 2Pr versus film thickness for a conventional PZT capacitor; and FIG. 13 shows a portion of an alternative embodiment of a ferroelectric memory in which groups of memory cells are serially linked.

DETAILED DESCRIPTION OF THE PREFERRED EMBODIMENT

1. Introduction

Figures 5, 6:
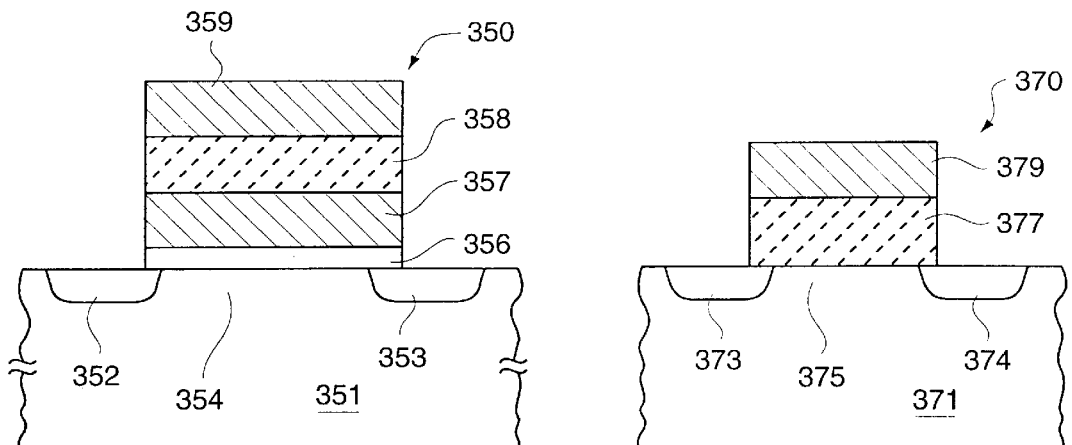

Directing attention to FIG. 1, a cross-sectional view of a ferroelectric FET 40 in accordance with the invention is shown. FET 40 includes a relatively complex FET structure, designed to illustrate in one place all the many layers that can be associated with a typical ferroelectric FET (FeFET). However, it should be understood that all of the layers except gate electrode 58 and ferroelectric layer 57 are optional. The FET 40 includes a substrate 41 which is preferably p-type silicon, but may be any other appropriate semiconductor, such as gallium arsenide, silicon germanium, and others. A deep well 43, preferably an n-type well, is formed in substrate 41, and a less deep well 45, preferably a p-type well, is formed within well 43. Doped active areas 42 and 44, preferably n-type, are formed in well 45. We shall generally refer to these active areas 42 and 44 herein as source/drains since they can either be a source or a drain depending on the relative voltages applied to the areas. A channel region 46, preferably also n-type, but not as highly doped as source/drains 42 and 44, is formed between source/drains 42 and 44. A gate structure 61 is formed on substrate 41 above channel region 46. In the preferred embodiment, gate structure 61 is a mutilayer structure, though usually it will not include all the layers 51 through 58 shown in FIG. 1. That is, the gate structure 61 shown in FIG. 1 is intended to illustrate the layers that could be included in the structure. The fundamental layers involved are an insulating layer 50, a floating gate layer 59, a ferroelectric layered superlattice material layer 57, and agate electrode layer 58. Insulating layer 50, often referred to as the "gate oxide", is shown as a multilayer structure comprising layers 51, 52, and 53, each of which is a different insulator. Preferably, layer 51 is an insulator closely related to the material of substrate 41. Preferably, layer 52 is a buffer or interface layer that can perform one or both of two functions: assisting in the adhesion of the layers above it to the layer below it; and preventing the migration of elements in the layers above it to the layers below it. Insulating layer 53 is considered to be the primary insulating layer of the gate, and is preferably a material having dielectric properties suitable for effective operation of the FET. It should be understood that a single material may perform the functions of layers 52 and 53, or even of all three layers 51, 52, and 53. A floating conducting gate 59 is formed on insulating layer 50. Again, the floating gate is shown as three layers, 54, 55, and 56. In one embodiment, layer 54 is a polysilicon layer, layer 55 is an adhesion layer, and layer 56 is a layer of a metal, such as platinum. In another embodiment, layer 54 is an adhesion layer that assists in adhesion of floating gate 59 to the layer below it. In this embodiment, layer 55 is considered to be the primary floating gate layer, and layer 56 is a conducting barrier layer, the purpose of which is to prevent the migration of elements in the layers above it to the layers below it. A ferroelectric layered superlattice material layer 57 is formed on floating gate 59. A gate electrode 58 is formed on ferroelectric layered superlattice material layer 57. It should be understood that ferroelectric layer 57 and gate electrode 58 can also be multilayer structures, though generally they are not. Wiring layers form electrical contacts 62, 64 and 66 to source/drain 42, source/drain 44, and substrate 41, respectively. Contact 66 is preferably located over a shallow p-well 47 at the junction between deep well 43 and well 45. Gate 58 is preferably integral with its own wiring layer, so a contact is not shown. As will be discussed in more detail below, in ferroelectric FET 40, the charge storage element is the ferroelectric layered superlattice material layer 57.

Preferably, when semiconductor 41 is silicon, insulating layer 51 is silicon dioxide. Preferably, insulating layer 52 is a buffer or interface layer, the purpose of which is to prevent elements in the layers above it from migrating into the semiconductor layer below it. It also may assist in adhering the layers above it to the layers below it. Buffer layer 52 preferably comprises $Ta_2O_5$, but may also be $CeO_2$ or any other suitable material that either prevents elements from migrating and/or assists in adhering the layers above it to the silicon layers below it. Layer 53 is a gate insulator which preferably comprises one or more materials selected from: $Ta_2O_5$, $SiO_2$, $CeO_2$, $ZrO_2$, $Y_2O_3$, $YMnO_2$, and $SrTa_2O_6$. Its thickness is preferably 4 nanometers (nm) to 50 nm. In one preferred embodiment, gate insulator 50 comprises a layer 51 of silicon dioxide and a layer 53 of $Ta_2O_5$. In this case, the layer of $Ta_2O_5$ acts as the primary gate insulator and a buffer layer as well. In other embodiments, gate insulator 53 is a high dielectric constant insulator containing metal oxide material in which the metal oxide has a stoichiometric formula $AB_2O_6$, wherein A represents at least one of strontium, barium and magnesium, and B represents at least one of tantalum and niobium. Preferably, the metal oxide comprises strontium tantalate having a formula $SrTa_2O_6$. The metal oxide gate insulator material may also be a solid solution containing a plurality of metal oxides, each of which has a stoichiometric formula $AB_2O_6$, wherein A represents at least one of strontium, barium and magnesium, and B represents at least one of tantalum and niobium. Thin films of strontium tantalate ($SrTa_2O_6$) in accordance with the invention are useful as gate insulators because they have a relative dielectric constant value, $\in_r$, of 80 or higher. They show negligible dependence of capacitance on external applied voltage. They exhibit negligible dispersion; that is, negligible effect of frequency on the dielectric constant. Thin films of $SrTa_2O_6$ show excellent potential for thickness scaling without affecting dielectric constant. They have a broad range of temperature range operability; variation in temperature has little effect on dielectric constant and loss tangent in the temperature range of 77°K. to 473°K.

In preferred embodiments, a Ta-containing insulating layer is in direct contact with a thin film of Ta-containing layered superlattice material, such as $SrBi_2Ta_2O_9$ or $Sr_aBi_b(Ta_cNb_d)O_{[9+(a-1)+(b-2)(1.5)]}$, where $0.9 \leq a \leq 1$, $2 \leq b \leq 2.2$, and $(c+d)=2$, and is, therefore, especially compatible with the ferroelectric metal oxide of the capacitor. For example, insulating layer 50 may comprise buffer layer 52 containing $Ta_2O_5$ and gate insulator 53 containing $SrTa_2O_6$ in contact with the ferroelectric layered superlattice material layer 57 containing strontium bismuth tantalate.

Ferroelectric layered superlattice material layer 57 comprises material as described in U.S. Pat. No. 5,519,234 issued May 21, 1996 to Paz de Araujo et al.; U.S. Pat. No. 5,434,102 issued Jul. 18, 1995 to Watanabe et al.; U.S. Pat. No. 5,784,310 issued Jul. 22, 1998 to Cuchiaro et al.; U.S. Pat. No. 5,840,110 issued Nov. 24, 1998 to Azuma et al., and U.S. patent application Ser. No. 08/405,885 filed Mar. 17, 1995 in the name of Azuma et al., all of which are incorporated herein by reference as though fully disclosed herein.

The layered superlattice materials have been catalogued by G. A. Smolenskii and others. See Chapter 15 of the book *Ferroelectrics and Related Materials*, ISSN 0275-9608, (V. 3 of the series Ferroelectrics and Related Phenomena, 1984) edited by G. A. Smolenskii, especially Sections 15.3–15.7; G. A. Smolenskii, A. I. Agranovskaya, "Dielectric Polarization of a Number of Complex Compounds", *Fizika Tverdogo Tela*, V. 1, No. 10, pp. 1562–1572 (October 1959); G. A. Smolenskii, A. I. Agranovskaya, V. A. Isupov, "New Ferroelectrics of Complex Composition", *Soviet Physics—Technical Physics*, pp, 907–908 (1959); G. A. Smolenskii, V. A. Isupov, A. I. Agranovskaya, "Ferroelectrics of the Oxygen-Octahedral Type With Layered Structure", *Soviet Physics—Solid State*, V. 3, No. 3, pp. 651–655 (September 1961); E. C. Subbarao, "Ferroelectricity in Mixed Bismuth Oxides With Layer-Type Structure", *J. Chem. Physics*, V. 34, p. 695 (1961); E. C. Subbarao, "A Family of Ferroelectric Bismuth Compounds", *J. Phys. Chem. Solids*, V. 23, pp. 665–676 (1962); and Chapter 8, pp. 241–292 and pp. 624–625 of Appendix F of *Principles and Applications of Ferroelectrics and Related Materials*, by M. E. Lines and A. M. Glass, Clarendon Press, Oxford, 1977, pp. 620–632. It has been discovered that the layered superlattice materials catalogued by Smolenskii et al. are all likely candidates for fatigue free switching ferroelectrics and dielectric materials that are resistant to degradation and breakdown over long periods of use. These materials may be represented by the formulae outlined by Smolenskii:

(I) compounds having the formula $A_{m-1}Bi_2M_mO_{3m+3}$, where $A=Bi^{3+}$, $Ba^{2+}$, $Sr^{2+}$, $Ca^{2+}$, $Pb^{2+}$, $K^+$, $Na^+$ and other ions of comparable size, and $M=Ti^{4+}$, $Nb^{5+}$, $Ta^{5+}$, $Mo^{6+}$, $W^{6+}$, $Fe^{3+}$ and other ions that occupy oxygen octahedral; this group includes bismuth titanate, $Bi_4Ti_3O_{12}$;

(II) compounds having the formula $A_{m+1}M_mO_{3m+1}$, including compounds such as strontium titanates $Sr_2TiO_4$, $Sr_3Ti_2O_7$ and $Sr_4Ti_3O_{10}$; and (III) compounds having the formula $A_mM_mO_{3m+2}$, including compounds such as $Sr_2Nb_2O_7$, $La_2Ti_2O_7$, $Sr_5TiNb_4O_{17}$, and $Sr_6Ti_2Nb_4O_{20}$. It is noted that in the case of $Sr_2Nb_2O_7$ and $La_2Ti_2O_{17}$ the formula needs to be doubled to make them agree with the general formula.

The materials of the invention include all of the above materials plus combinations and solid solutions of these materials. The layered superlattice materials may be summarized generally under the formula:

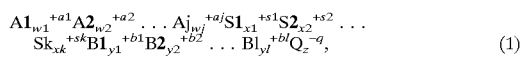

$$A1_{w1}^{+a1}A2_{w2}^{+a2}\ldots Aj_{wj}^{+aj}S1_{x1}^{+s1}S2_{x2}^{+s2}\ldots Sk_{xk}^{+sk}B1_{y1}^{+b1}B2_{y2}^{+b2}\ldots Bl_{yl}^{+bl}Q_z^{-q}, \quad (1)$$

where A1, A2 . . . Aj represent A-site elements in the perovskite-like structure, which may be elements such as strontium, calcium, barium, bismuth, lead, and others; S1, S2 . . . Sk represent superlattice generator elements, which usually is bismuth, but can also be materials such as yttrium, scandium, lanthanum, antimony, chromium, thallium, and other elements with a valence of +3; B1, B2 . . . Bl represent B-site elements in the perovskite-like structure, which may be elements such as titanium, tantalum, hafnium, tungsten, niobium, zirconium, and other elements; and Q represents an anion, which generally is oxygen but may also be other elements, such as fluorine, chlorine and hybrids of these elements, such as the oxyfluorides, the oxychlorides, etc. The superscripts in Formula (1) indicate the valences of the respective elements; for example, if Q is oxygen, then q=2. The subscripts indicate the number of moles of the material in a mole of the compound, or in terms of the unit cell, the number of atoms of the element, on the average, in the unit cell. The subscripts can be integer or fractional. That is, Formula (1) includes the cases where the unit cell may vary uniformly throughout the material; for example, in $SrBi_2(Ta_{0.75}Nb_{0.25})_2O_9$, 75% of the B-sites are occupied by strontium atoms, and 25% of the B-sites are occupied by barium atoms. If there is only one A-site element in the compound, then it is represented by the "A1" element and w2 . . . wj all equal zero. If there is only one B-site element in the compound, then it is represented by the "B1" element, and y2 . . . yl all equal zero, and similarly for the superlattice generator elements. The usual case is that there is one A-site element, one superlattice generator element, and one or two B-site elements, although Formula (1) is written in the more general form since the invention is intended to include cases where the A-sites, B-sites and the superlattice generator can have multiple elements. The value of z is found from the equation:

$$(a1w1+a2w2\ldots+ajwj)+(s1\times1+s2\times2\ldots+sk\times k)+(b1y1+b2y2\ldots+blyl)=qz. \quad (2)$$

Formula (1) includes all three of the Smolenskii type compounds discussed in U.S. Pat. No. 5,519,234 issued May 21, 1996, referenced above. The layered superlattice materials do not include every material that can be fit into Formula (1), but only those that form crystalline structures with distinct alternating layers.

Formula (1) includes all three of the Smolenskii type compounds: for the type I material, w1=m−1, x1=2, y1=m, z=3m+3 and the other subscripts equal zero; for the type II material, w1=m+1, y1=m, z=3m+1, and the other subscripts equal zero; for the type III material, w1=m, y1=m, z=3m+2, and the other subscripts equal zero. It is noted that the Smolenskii type I formula does not work for M=Ti and m=2, while the Formula (1) does work. This is because the Smolenskii formula does not consider valences. The layered superlattice materials do not include every material that can be fit into the Formula (1), but only those which form crystalline structures with distinct alternating layers during crystallization. Crystallization is typically assisted by thermally treating or annealing the mixture of precursor ingredients. The enhanced temperature facilitates ordering of the superlattice-forming moieties into thermodynamically favored structures, such as perovskite-like octahedra. The term "superlattice generator elements" as applied to S1, S2 . . . Sk, refers to the fact that these metals are particularly stable in the form of a concentrated metal oxide layer interposed between two perovskite-like layers, as opposed to a uniform random distribution of superlattice generator metals throughout the mixed layered superlattice material. In particular, bismuth has an ionic radius that permits it to function as either an A-site material or a superlattice generator, but bismuth, if present in amounts less than a threshold stoichiometric proportion, will spontaneously concentrate as a nonperovskite-like bismuth oxide layer. It should also be understood that the term "layered superlattice material" herein also includes doped layered superlattice materials. That is, any of the material included in Formula (1) may be doped with a variety of materials, such as silicon, germanium, uranium, zirconium, tin or hafnium. In summary, the materials of the invention include all the materials as described by the Smolenskii formulae and Formula (1), plus solid solutions of all the foregoing materials.

Some preferred ferroelectric layered superlattice materials include the metal oxides $SrBi_2Ta_2O_9$ (SBT), $SrBi_2(Ta_{1-x}Nb_x)_2O_9$ (SBTN), where $0 \leq x \leq 1$, and particularly $Sr_aBi_b(Ta_{1-x}Nb_x)_cO_{[9+(a-1)+(b-2)(1.5)+(c-2)(2.5)]}$, where $0.8 \leq a \leq 1$, $2 \leq b \leq 2.6$, $0 \leq x \leq 0.6$ and $1.9 \leq c \leq 2.3$ (SBTN). Polycrystalline thin films of these layered superlattice materials, as well as other layered superlattice materials represented by Formula (1), may be fabricated and used in accordance with the invention.

The word "superlattice" herein may mean something slightly different than it means in some physics contexts, such as superconductivity. Sometimes the word "superlattice" carries with it connotations of single crystal structures only. However, the materials in accordance with the invention are preferably not single crystals. In fact, none of the materials produced to date are single crystals, though it is believed that single crystals of these materials can be made. The materials of the invention are preferably polycrystalline. In the polycrystalline state, the structure of the materials includes grain boundaries, point defects, dislocation loops and other microstructure defects. However, for the perovskite-like materials cataloged by Smolenskii and others, within each grain, the structure is predominately repeatable units containing one or more perovskite-like layers and one or more intermediate non-perovskite-like layers spontaneously linked in an interdependent manner. It will be recognized by those skilled in the art that the term "layered superlattice materials" is intended to include all materials that spontaneously form themselves into crystal structures that include a first layer and a second layer, with the first and second layers having distinctly different crystal structures. Heterostructures, such as compositional superlattices, are not included.

The term "stoichiometric" herein may be applied to both a solid film of a material, such as a layered superlattice material, or to the precursor for forming a material. When it is applied to a solid thin film, it refers to a formula which shows the actual relative amounts of each element in a final solid thin film. When applied to a precursor, it indicates the molar proportion of metals in the precursor. A "balanced" stoichiometric formula is one in which there is just enough of each element to form a complete crystal structure of the material with all sites of the crystal lattice occupied, though in actual practice there always will be some defects in the crystal at room temperature. For example, both $SrBi_2(TaNb)O_9$ and $SrBi_2(Ta_{1.5}Nb_{0.5})O_9$ are balanced stoichiometric formulae. In contrast, a precursor for strontium bismuth tantalum niobate in which the molar proportions of strontium, bismuth, tantalum, and niobium are 0.9, 2.18, 1.5, and 0.5, respectively, is represented herein by the unbalanced "stoichiometric" formula $Sr_{0.9}Bi_{2.18}(Ta_{1.5}Nb_{0.5})O_9$, since it contains excess bismuth and deficient strontium relative to the B-site elements tantalum and niobium. It is common in the art to write an unbalanced stoichiometric formula of a metal oxide in which the subscript of the oxygen symbol is not corrected to balance completely the subscript values of the metals.

The word "precursor" used herein can mean a solution containing one metal organic solute that is mixed with other precursors to form intermediate precursors or final precursors, or it may refer to a final liquid precursor solution, that is, the solution to be applied to a particular surface during fabrication. The precursor as applied to the substrate is usually referred to as the "final precursor", "precursor mixture", or simply "precursor". In any case, the meaning is clear from the context.

The term "thin film" is used herein as it is used in the integrated circuit art. Generally, it means a film of less than a micron in thickness. The thin films disclosed herein are in all instances 0.5 microns in thickness or less. These thin films of the integrated circuit art should not be confused with the so-called "thin films" in layered capacitors of the macroscopic capacitor art which are formed by a wholly different process which is incompatible with the integrated circuit art.

Floating gate 59 and gate 58 are preferably made of platinum, though they may be any other suitable conductor. As shown in FIG. 1, floating gate 59, which is sometimes referred to in the art as the bottom electrode, may be a multilayer structure which may include an adhesive layer 54 or 55, depending on the embodiment. The adhesion layer is typically titanium and preferably approximately 20 nm thick. The layer above the adhesion layer is preferably an approximately 100 nm to 200 nm thick layer of platinum. Floating gate 59 may also include a barrier layer 56, which preferably is $Ta_2O_5$, but may be $IrO_2$ or other material, preferably about 4 nm to 40 nm thick. The only essential parts of FET 40 are semiconductor 41, ferroelectric layered superlattice material layer 57 and gate 58. The other layers are optional. One or more may be omitted in any specific embodiment. Further, the order of the layers 51–58 may be varied, and additional layers may be added.

It should be understood that the FIGS. 1, and 3–8 depicting integrated circuit devices are not meant to be actual plan or cross-sectional views of any particular portion of an actual integrated circuit device. In the actual devices, the layers will not be as regular and the thicknesses will generally have different proportions. The figures instead show idealized representations that are employed to depict more clearly and fully the structure and process of the invention than would otherwise be possible. For example, if the various thicknesses of the layers were correct relative to one another, the drawing of the FET would either have layers that are too small to see clearly or would not fit on the paper.

Terms of orientation herein, such as "above", "over", "top", "upper", "below", "bottom" and "lower", mean relative to semiconductor substrate 41. That is, if a second element is "above" a first element, it means it is farther from substrate 41, and if it is "below" another element then it is closer to substrate 41 than the other element. The long dimension of substrate 41 defines a substrate plane that is defined by the horizontal direction and the direction into and out of the paper in FIG. 1. Planes parallel to this plane are called a "horizontal" plane herein, and directions perpendicular to this plane are considered to be "vertical". A memory cell typically comprises relatively flat thin film layers. The terms "lateral" or "laterally" refer to the direction of the flat plane of the thin film layers. In FIG. 1, the lateral direction would be the horizontal direction. The terms "underlie" and "overlie" are also defined in terms of substrate 41. That is, if a first element "underlies" a second "overlying" element, it means that a line perpendicular to the substrate plane that passes through the first element also passes through the second element.

This specification refers to a buffer and/or barrier layer located between a semiconductor and thin film of ferroelectric material. The term "between" does not mean that the buffer and/or barrier layer is in direct contact with the thin film of ferroelectric material or the semiconductor. The buffer and/or barrier layer may contact the ferroelectric or semiconductor, but typically, it does not. The term "on" is sometimes used in the specification when referring to the deposition or formation of an integrated circuit layer onto an underlying substrate or layer. In contrast to "between", the term "on" generally signifies direct contact, as is clear in the various contexts in which it is used.

In this disclosure, the terms "row" and "column" are relative terms that are used to facilitate the disclosure. That is, conventionally, a row is a horizontal line or alignment and a column is a vertical line or alignment. However, the invention contemplates that in any array, rows can become columns and columns can become rows simply by viewing the array from a perspective that is rotated by 90 degrees, 270 degrees, etc. Thus, because a memory architecture is rotated by 90 degrees, 270 degrees, etc., from the invention described in the summary of the invention, the specification, or claims herein, but otherwise is the same, does not take it outside of the architectures contemplated by the invention.

The term "high dielectric constant" means a dielectric constant of ten or greater. Conventional dielectrics in integrated circuit capacitors and transistors have a dielectric constant of about 4 or 5. Thus, a high dielectric constant material has a dielectric constant of at least twice the dielectric constant of a conventional dielectric material used in an integrated circuit.

The term "$AB_2O_6$-type oxide" refers generally to nonferroelectric material containing metal oxides with a chemical composition represented by the general stoichiometric formula $AB_2O_6$, wherein A represents at least one of strontium and barium, and B represents at least one of tantalum and niobium. The term herein includes the following oxides: $SrTa_2O_6$, $SrNb_2O_6$, $BaTa_2O_6$ and $BaNb_2O_6$. The term can refer, therefore, both to material containing only one particular type of metal oxide compound, such as $SrTa_2O_6$, and also to solid solutions of a plurality of chemical species, for example, a solid solution of $SrTa_2O_6$ and $SrNb_2O_6$.

FIG. 2 shows the equivalent circuit for the preferred embodiment of the ferroelectric FET of FIG. 1. A voltage, $V_s$, is applied to source 42, a voltage, $V_b$, is applied to substrate 41, a voltage, $V_d$, is applied to drain 44, and a gate voltage, $V_g$, is applied to gate 58. These voltages may either be a high or logic "1" voltage, a low, or logic "0" voltage, an open or high resistance state, generally designated as "Z" herein, or a small positive or negative voltage between the logic "0" and logic "1" states. In the preferred embodiment of the read process, the drain voltage Vd takes on a small positive value, which generally is significantly less than the high voltage.

For example, if a positive write bias voltage, $V_g$, is applied to gate 58, then the resulting electric field exerted on ferroelectric thin film 57 causes ferroelectric thin film 57 to be polarized, even after the voltage and field are no longer applied. The remnant polarization in ferroelectric thin film 57 exerts an electric field through interface insulating layer 50 into channel region 46, attracting electrons into channel region 46, and thereby causing an increase of free electrons available for conduction of electric current. As a result, when drain voltage, $V_d$, is applied to drain region 44 in a read operation, a current sensor senses high current across channel region 46, and reads a binary "1" state. When a negative $V_g$ is applied to gate 58 in the write operation, then the resulting remnant polarization in ferroelectric thin film 57 repels current-carrying electrons from, or attracts positive holes into, channel region 46, and the resulting low current is sensed as the binary "0" state when $V_d$ is applied to drain 42 in a read operation. The write bias voltage, $V_g$, and the read bias voltage, $V_d$, are typically in the range of 1 volt to 15 volts, and most preferably in the range of about 2 volts to 5 volts. Preferably, the low or logic "0" voltage is zero or the ground state. If the voltage across ferroelectric 57 is equal to or greater than the coercive voltage, essentially all the ferroelectric domains in the material 57 will become polarized; but even a small voltage, e.g. 1.0 volt, will cause some domains to switch.

From the above discussion, it is seen that the data stored in the ferroelectric FET 40 is stored as a polarization charge in the ferroelectric layered superlattice material layer 57. Thus, the ferroelectric layer 57 is the charge storage element of the FeFET.

As known in the art, if a ferroelectric FET is to provide a workable memory, a graph of gate voltage versus drain current must follow a hysteresis curve. Starting at a zero gate voltage, there is essentially no drain current, because the resistance in channel 46 is very high. As the gate voltage increases, there remains no drain current until a positive threshold voltage, $+V_{th}$, is reached. At this voltage, ferroelectric 57 switches into the ON state and attracts carriers into channel 46 causing a drain current. Then, as the gate voltage continues to increase, the drain current increases linearly until a saturation current, $I_{sat}$, is approached. After saturation, as the gate voltage increases, there is no increase in current, and the curve continues flat. As the gate voltage is decreased, the drain current remains the same until a negative threshold voltage, $-V_{th}$, is approached. Then the drain current decreases linearly until it approaches the point where the ferroelectric switches into the OFF state, at which point the drain current goes to zero. The drain current remains at zero no matter how large a negative voltage is applied, and, as the voltage is increased, does not rise above zero until the positive threshold voltage is reached. The area of the hysteresis curve is called the "memory window". To obtain a workable memory device, the width of the memory window, i.e. $+V_{th}$ to $-V_{th}$, must be greater than the noise in gate electrode 58, and the height of the memory window, i.e. $I_{sat}$, must be greater than the noise in the drain and associated sense circuit. For a non-volatile memory, the zero volts line should ideally be centered in the memory window, or at least well within the noise margins, since the device should retain the data without external power. A high ratio of $I_{sat}$ in the ON state and $I_{sat}$ in the OFF state is also desirable to permit ease of discrimination of the two states by the sensing circuit.

The memory window for an exemplary ferroelectric FET including a layered superlattice material in accordance with the invention in which the DC gate bias was swept from −10 volts to +10 volts and back has been measured at approximately 2.1 volts, and the center of the window was at approximately one volt. The difference between the ON current and the OFF current was eight decades; thus, the polarization was easily distinguishable. In addition, the drain to source current in amperes versus time in seconds was measured for a ferroelectric FET in accordance with the invention after a positive pulse of 4.5 volts was applied to the gate for two seconds. During the measurement, $V_d$ was at one volt and D.C. bias of 1.6 volts was applied to the gate. After a 3% decay during the first two minutes, the source drain current remained essentially unchanged for 5000 seconds, or about 1.4 hours. Another measurement was made after 17 hours, and the source drain current was unchanged. This indicates that a ferroelectric FET in accordance with the invention can hold data essentially indefinitely.

The invention contemplates that the materials of the invention can be used with any FET structure. FIGS. 3 through 6 illustrate various FET gate configurations in which the materials in accordance with the invention may be used. For easier understanding, the details of the substrate architecture are not shown in these figures. However, it should be understood that in the preferred embodiment they would include deep- and/or p-wells as shown in FIG. 1. In alternative embodiments, they can be combined with other substrate architectures as well. FIG. 3 shows a MFMISFET 150 that includes a polysilicon layer 172 between electrode 157 and insulating layer 173. This FET is again formed on a semiconductor 151, and includes source/drains 152 and 153, channel 154, barrier layer 161, ferroelectric 158, and electrode 159. The polysilicon layer in this and other embodiments herein permits the FET to be fabricated with standard CMOS FET fabrication processes. These processes usually include a polysilicon deposition step, and the inclusion of the polysilicon into the FET architecture permits this step to be retained. The use of polysilicon as the lower electrode in an MFMISFET also results in an excellent interface being made with a silicon substrate 151 and a silicon dioxide gate insulating layer 173. In addition, the MFMISFET 150 illustrates another feature of the FET structure that may be utilized in the invention: the ferroelectric capacitor (first capacitor) portion 164 has a smaller area than the insulator capacitor (second capacitor) portion 165 formed by conductor 172, insulator 173, and channel 154. Since capacitance is proportional to the area of the capacitor and the voltage drop across each of a number of capacitors connected in series is inversely proportional to the respective capacitances of the capacitors, this results in a larger portion of the total voltage drop across the FET being across the ferroelectric. This, in turn, permits the ferroelectric FET to operate at a lower voltage. This feature of making the ferroelectric capacitor, such as 164, smaller in area than the insulator capacitor, such as 165, to create a larger voltage drop across the ferroelectric capacitor can be used in any of the embodiments of the invention disclosed herein.

FIG. 4 shows an MFMISFET 250 including a barrier layer 261 and an insulator layer 260. This FET is again formed on a semiconductor 251, and includes source/drains 252 and 253, channel 254, ferroelectric 258, gate electrode 259, and floating gate electrode 257. The barrier layer 261 is preferably tantalum pentoxide ($Ta_2O_5$), but may be iridium oxide ($IrO_2$) or other suitable barrier materials. Insulator layer 260 preferably comprises $SrTa_2O_6$. In this embodiment, electrode 257 forms both one of the electrodes of ferroelectric capacitor 264 and one of the electrodes of the larger insulator capacitor 265.

FIG. 5 shows an MFMISFET 350 which can also serve as the FET to implement the invention. This FET is again formed on a semiconductor 351, and includes source/drains 352 and 353, channel 354, gate insulating layer 356, ferroelectric 358, and electrode 359, and a floating gate electrode 357. Insulating layer 356 can be a single insulating layer or multiple insulating layers as discussed above. Contacts, wiring layers and other architecture can take on any of the forms shown or discussed above or below.

FIG. 6 shows an MFSFET 370 that can also serve as the FET to implement the invention. This FET is again formed on a semiconductor 371, and includes source/drains 373 and 374, channel 375, ferroelectric 377, and electrode 379. Contacts, wiring layers and other architecture can take on any of the forms shown or discussed above or below.

The above FETs 40, 150, 250, 350, and 370 illustrate only a few of the many FET configurations in which the materials of the invention may be used. FETs using any combination of the various layers and features shown in any of the above FETs may also be utilized.

Figure 7:
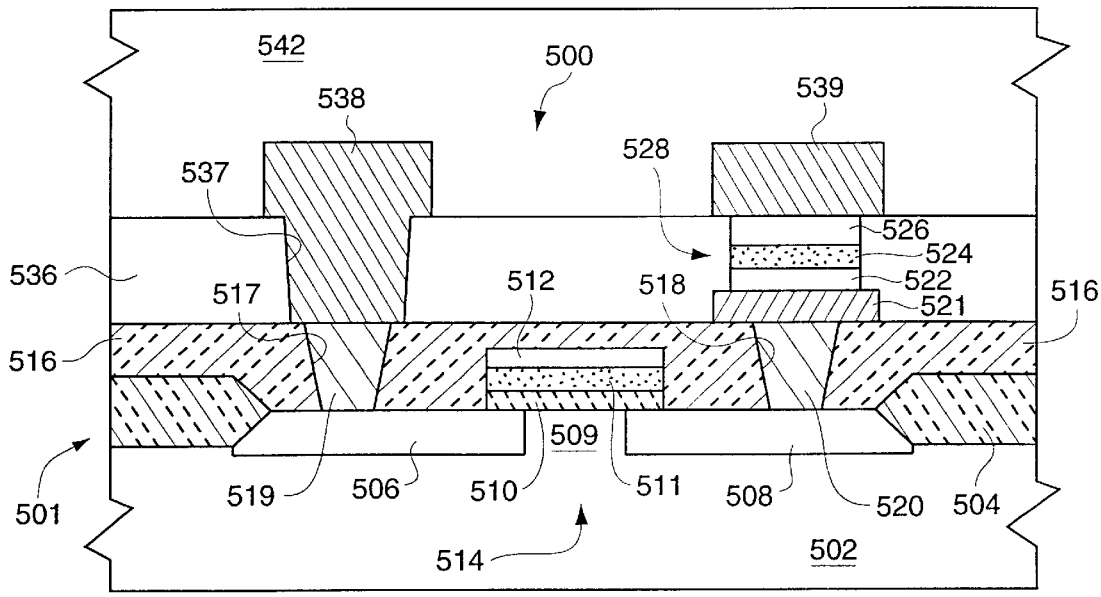
FIG. 7 is a cross-sectional view a DRAM or FERAM memory cell having a field effect transistor in accordance with the invention.

FIG. 7 shows a charge storage device, i.e., memory cell 500, in which the material in accordance with the invention is used as a gate insulator 511. Memory cell 500 includes transistor 514 and capacitor 528 formed on a wafer 501 including semiconductor substrate 502. Semiconductor substrate 502 may comprise silicon, gallium arsenide, silicon germanium, or other semiconductor, and may also include other substrate materials such as ruby, glass or magnesium oxide. In the preferred embodiment, it is silicon. A field oxide region 504 is formed on a surface of semiconductor substrate 502. Semiconductor substrate 502 comprises a highly doped source region 506 and a highly doped drain region 508, which are formed about a doped channel region 509. Doped source region 506, drain region 508 and channel region 509 are preferably n-type doped regions, but also may be p-type. Buffer/diffusion barrier layer 510, comprising a thin film of electrically nonconductive material in accordance with the invention, is located on semiconductor substrate 502, above channel region 509. Buffer/diffusion barrier layer 510 has a thickness in the range of from 1 nm to 30 nm, preferably 1 nm to 5 nm. A gate insulator 511 comprising a thin film of high dielectric constant insulator in accordance with the invention is located on buffer/diffusion barrier layer 510. Further, a gate electrode 512 is located on gate insulator 511. Gate insulator 511 has a thickness in the range of from 1 nm to 50 nm, preferably from 5 nm to 20 nm. These source region 506, drain region 508, channel region 509, buffer/diffusion barrier layer 510, gate insulator 511 and gate electrode 512 together form a MOSFET 514.

A first interlayer dielectric ("ILD") layer 516, preferably made of BPSG (boron-doped phospho-silicate glass) is located on semiconductor substrate 502 and field oxide region 504. ILD 516 is patterned to form vias 517, 518 to source region 506 and drain region 508, respectively. Vias 517, 518 are filled to form plugs 519, 520, respectively. Plugs 519, 520 are electrically conductive and typically comprise polycrystalline silicon, tungsten, or tantalum but may be any other suitable conductor. An electrically conductive buffer/diffusion barrier layer 521 in accordance with the invention is located on ILD 516 in electrical contact with plug 520. Conductive diffusion barrier layer 521 is typically made of $IrO_2$, but may be made of other materials and typically has a thickness of from 1 nm to 30 nm, preferably from 1 nm to 5 nm.

As depicted in FIG. 7, a bottom electrode layer 522 is located on diffusion barrier layer 521. It is preferable that the bottom electrode contains a non-oxidized precious metal such as platinum, palladium, silver, and gold. In addition to the precious metal, metals such as aluminum, aluminum alloy, aluminum silicon, aluminum nickel, nickel alloy, copper alloy, and aluminum copper may be used for electrodes of a dielectric or ferroelectric memory. In the preferred embodiment, bottom electrode 522 is made of platinum and has a thickness of 100 nm. Preferably, it also includes at least one adhesive layer (not shown), such as titanium, to enhance the adhesion of the electrodes to adjacent underlying or overlying layers of the circuits. Capacitor dielectric 524, comprising a thin film of high dielectric constant insulator in accordance with the invention, is located on bottom electrode layer 522. Capacitor dielectric 524 has a thickness in the range of from 5 nm to 500 nm, preferably from 30 nm to 100 nm. A top electrode layer 526, made of platinum and having a thickness of 100 nm, is formed on capacitor dielectric 524. Bottom electrode layer 522, thin film capacitor dielectric 524 and top electrode layer 526 together form memory capacitor 528. Diffusion barrier layer 521 inhibits the diffusion of metal atoms and oxygen from capacitor dielectric 524 and bottom electrode 522 into the semiconductor substrate. A second interlayer dielectric layer (ILD) 536, preferably made of NSG (nondoped silicate glass) is deposited to cover ILD 516, buffer/diffusion barrier layer 521, and dielectric memory capacitor 528. A PSG (phospho-silicate glass) film or a BPSG (boron phospho-silicate glass) film or other insulator could also be used in layer 536. ILD 516 and ILD 536 may also be made of the layered superlattice material in accordance with the invention. ILD 536 is patterned to form via 537 to plug 519. A metallized wiring film is deposited to cover ILD 536 and fill via 537 and then patterned to form source electrode wiring 538 and top electrode wiring 539. Wirings 538, 539 preferably comprise Al—Si—Cu standard interconnect metal with a thickness of about 200 nm to 300 nm, but may include other metals mentioned above.

The structure shown in FIG. 7 in which capacitor 528 is stacked on top of ILD 536 and thus separated from transistor 514 is conventionally called a "stacked capacitor" structure and the process of making a structure such as this is well-known in the art. If layer 524 is a high dielectric constant material, integrated circuit charge storage device 500 is a DRAM cell; if layer 524 is a ferroelectric, then device 500 is an FERAM cell. The non-ferroelectric high dielectric constant materials of the invention may be used as gate dielectric 511, capacitor dielectric material 524, or interlayer dielectric 516 or 536.

As known in the art, whether transistor 483 is "on" or "off" is determined by whether or not sufficient charge is stored in gate insulator 511 or at the interfaces of the insulator with its corresponding gate and channel; thus, insulator 511 shall be referred to as the charge storage element of the FET.

Figure 8:
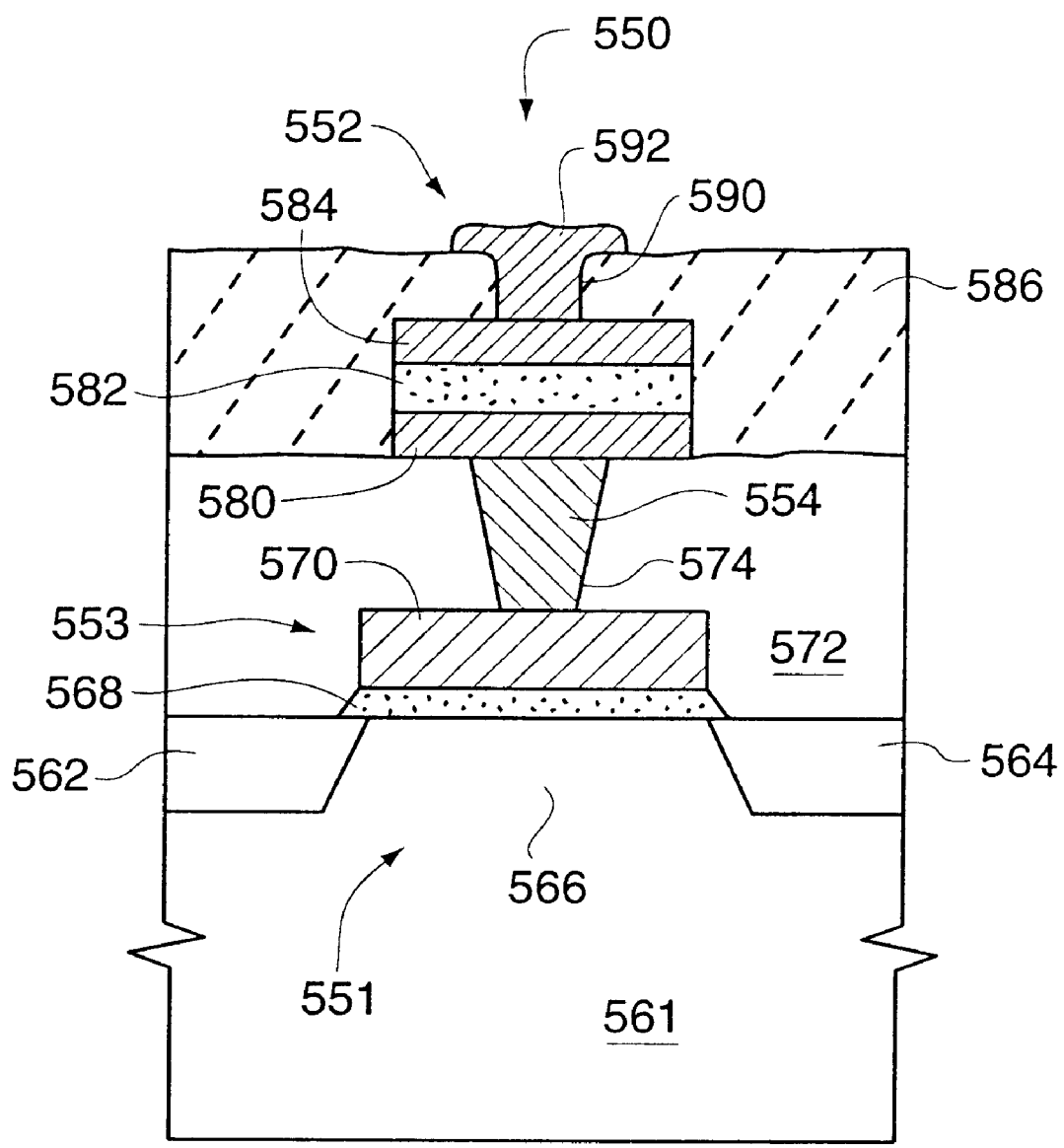
FIG. 8 is a cross-sectional view an alternative embodiment of an MFM-MIS FET in accordance with the invention.

FIG. 8 shows a cross-sectional view of a portion of an MFM-MIS FET memory cell 550 in accordance with a preferred embodiment of the invention. The MFM-MIS FET memory cell 550 comprises a field effect transistor ("FET") 551, a metal-ferroelectric-metal ("MFM") capacitor 552, and metal-insulator-semiconductor ("MIS") capacitor 553 connected in series with MFM capacitor 552 by an interconnect 554. In an MFM-MIS memory, MIS capacitor 553 is part of FET 551. MFM-MIS FET memory cell 550 is formed on semiconductor substrate 561, which includes a highly doped source region 562, a highly doped drain region 564, and a channel region 566. FET 551 comprises source region by 562, drain region by 564, channel region by 566, gate oxide layer 31 and gate electrode 570. MIS capacitor 553 comprises gate electrode 570, gate oxide 568 and semiconductor substrate 561. FET 551 and MIS 553 are covered by a standard interlayer dielectric ("ILD") 572, comprising a glasseous oxide, preferably a boron-doped phosphosilicate glass ("BPSG"). A via 574 from the top of ILD 572 down to the surface of gate electrode 570 is filled with interconnect 554, typically called a conductive plug. A bottom electrode 580 is located on ILD 572, covering interconnect 554. A ferroelectric thin film 582 is located on bottom electrode 580, and top electrode 584 is located on ferroelectric layered superlattice material thin film 582. Bottom electrode 580, ferroelectric thin film 582 and top electrode 584 together form ferroelectric MFM capacitor 552. A second interlayer dielectric, ILD 586, covers ILD 572 and MFM 552. A wiring hole 590 extends through ILD 586 to top electrode 584. Local interconnect 592 fills wiring hole 590.

FIGS. 1 and 3–8 depict only a few of the many variations of memory cells that can be fabricated using the method of the invention. The material in accordance with the invention may, in fact, be used in any capacity of any memory cell in which a dielectric or ferroelectric material may be used.

In any of the above embodiments, the conductive barrier layer is preferably $IrO_2$. The gate insulator layer and or the dielectric buffer layer is preferably tantalum pentoxide ($Ta_2O_5$), but also may be selected from: $SiO_2$, $CeO_2$, $ZrO_2$, $Y_2O_3$, $YMnO_2$, and $SrTa_2O_6$. If the insulator is $SiO_2$, its thickness is preferably 4 nm to 20 nm; for other materials it is preferably 4 nm to 50 nm.

Figure 9:
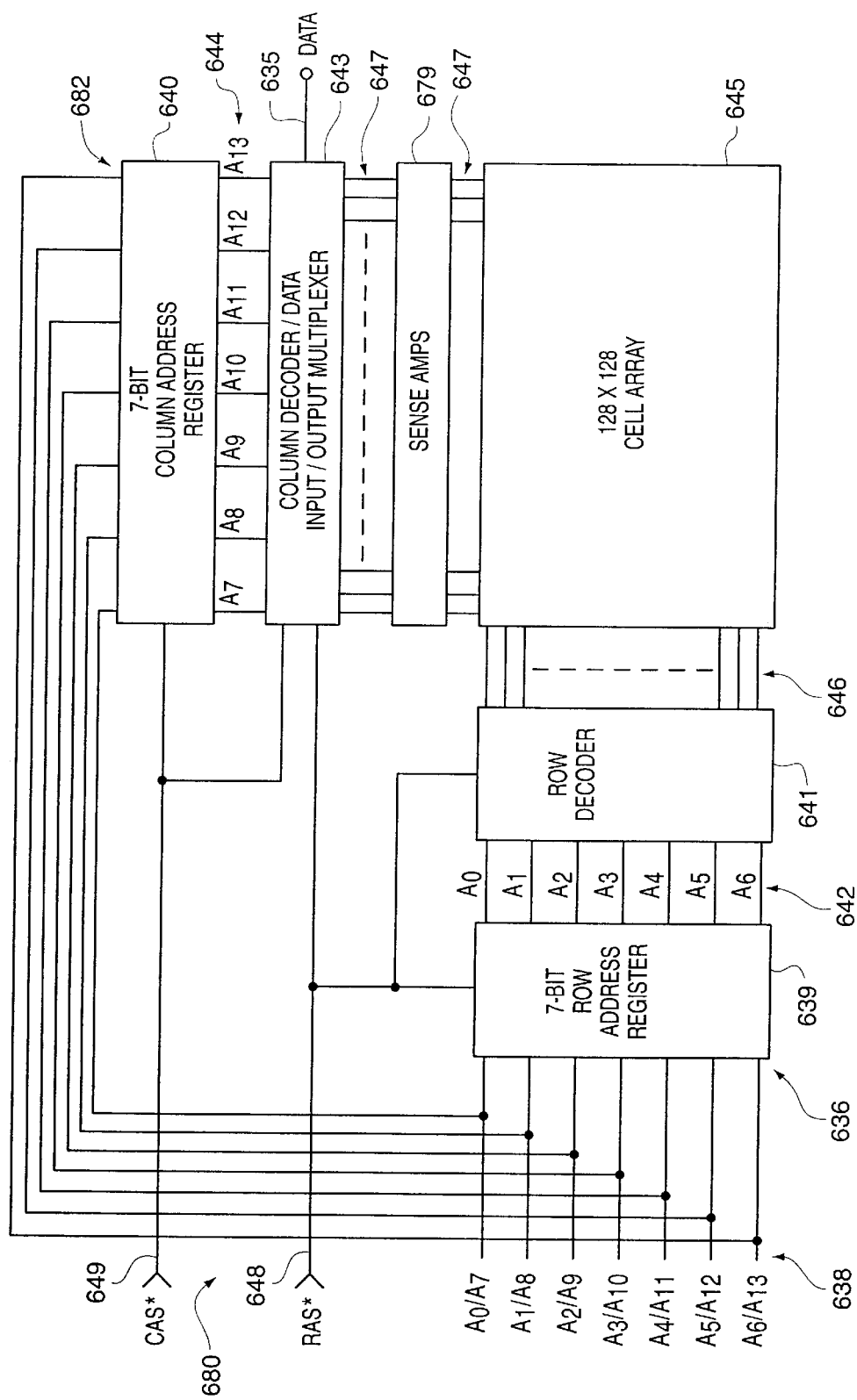
FIG. 9 is a block circuit diagram of an integrated circuit memory in accordance with the invention utilizing memory cells such as those shown in FIGS. 1–8, groups of cells such as shown in FIG. 13.

FIG. 9 is a block diagram illustrating an exemplary integrated circuit memory 636 in which the memory cells of FIGS. 1–8 made with the materials of the invention are utilized. For simplicity, the embodiment shown is for a 16K×1 DRAM; however the material may be utilized in a wide variety of sizes and types of memories, both volatile and non-volatile. In the 16K embodiment shown, there are seven address input lines 638 which connect to a row address register 639 and a column address register 640. The row address register 639 is connected to row decoder 641 via seven lines 642, and the column address register 640 is connected to a column decoder/data input output multiplexer 643 via seven lines 644. The row decoder 641 is connected to a 128×128 memory cell array 645 via 128 lines 646, and the column decoder/data input output multiplexer 643 is connected to the sense amplifiers 79 and memory cell array 645 via 128 lines 647. A RAS*signal line 648 is connected to the row address register 639, row decoder 641, and column decoder/data input/output multiplexer 643, while a CAS*signal line 649 is connected to the column address register 640 and column decoder/data input output multiplexer 643. (In the discussion herein, an "*" indicates the inverse of a signal.) An input/output data line 645 is connected to the column decoder/data input output multiplexer 643.

Memory cell array 645 contains 128×128=16,384 memory cells, which is conventionally designated as 16K. These cells are preferably ferroelectric FET cells, a circuit diagram of which is shown in FIG. 2. Detailed memory architectures of such cells are shown in U.S. patent application Ser. No. 09/385,308 filed Aug. 30, 1999, and U.S. patent application Ser. No. 09/523,492 filed Mar. 10, 2000, which are hereby incorporated by reference as though fully disclosed herein. They also may be ferroelectric switching capacitor-based cells, dielectric capacitor-based cells, or any other memory cell utilizing the material of the invention.

The operation of the memory in FIG. 9 is as follows. Row address signals $A_0$ through $A_6$ and column address signals $A_7$ through $A_{13}$ placed on lines 638 are multiplexed via address registers 639, 640 and the RAS* and CAS*signals to the row decoder 641 and column decoder/data input/output multiplexer 643, respectively. The row decoder 641 places a high signal on the one of the wordlines 636 that is addressed. The column decoder/data input output multiplexer 643 either places the data signal on line 645 on the one of the bit lines 647 corresponding to the column address, or outputs on the data line 645 the signal on the one of the bit lines 647 corresponding to the column address, depending on whether the function is a write or read function. As is known in the art, the read function is triggered when the RAS*signal precedes the CAS*signal, and the write function is triggered when the CAS*signal comes before the RAS*signal. As is well-known in the art, the sense amplifiers 79 are located along lines 647 to amplify the signals on the lines. Other logic required or useful to carry out the functions outlined above as well as other known memory functions is also included in the memory 636, but is not shown or discussed as it is not directly applicable to the invention. As outlined above, the RAS* and CAS*lines 638 and 639, registers 639, 640, and the decoders 641, 642 comprise an information write means 680 for placing the memory cell, such as 40 (FIGS. 1 and 2), in a first memory state or a second memory state depending upon information input to the memory on data line 645, the first memory cell state corresponding to the layer 57 of ferroelectric material being in a first polarization state, and the second memory cell state corresponding to the layer 57 being in a second polarization state; these components, plus sense amplifiers 679, comprise an information read means 682 for sensing the state of memory cell, such as 40, and providing an electrical signal corresponding to the state.

It should be understood that the memory 436 described above is merely an example of one such memory. Other architectures such as ones in which the data is input on lines connected to rows and output on lines connected to columns, or where there are several different column lines and/or several different row lines associated with each cell, may be used.

It should be understood that the invention contemplates that any and all of the features of the various embodiments of the memory cells disclosed above can be combined with each other. That is, the embodiments shown are exemplary and have been chosen to illustrate the respective features, and are not intended to be limiting to the particular combinations shown.

Figure 10:
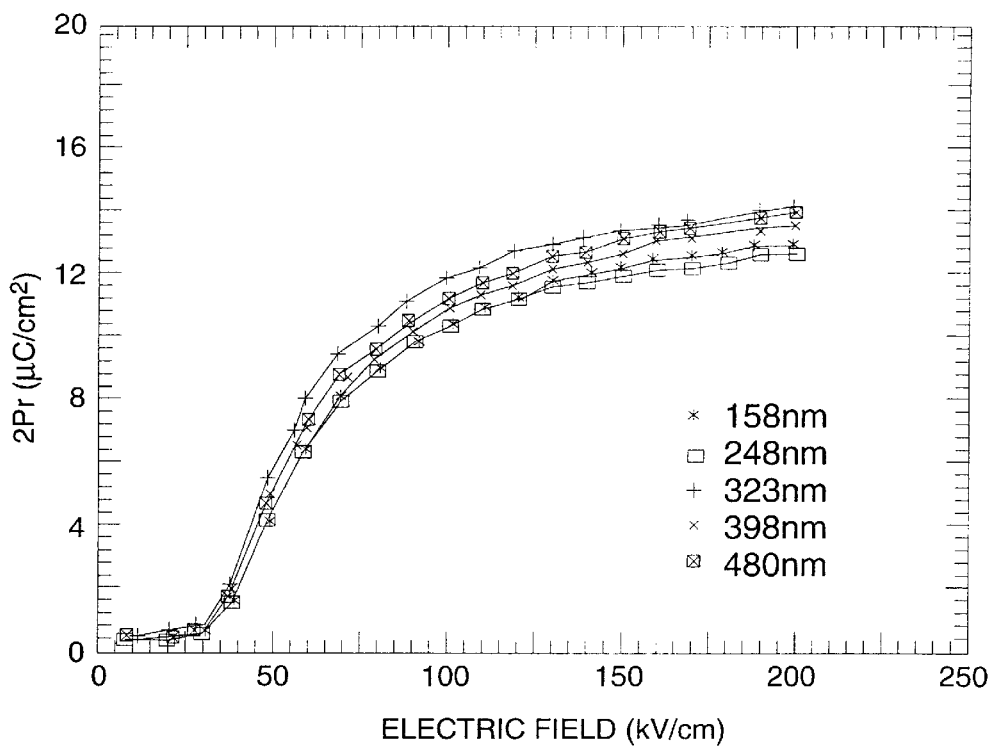
FIG. 10 is a graph of 2Pr-values plotted versus electric field for four different samples of polycrystalline $SrBi_2Ta_2O_9$ having a variety of thicknesses.
Figure 11:
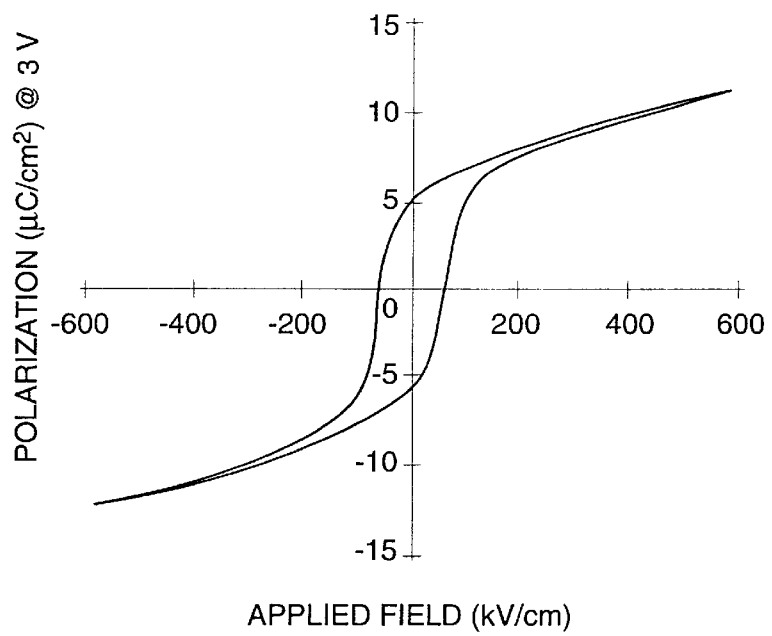
FIG. 11 shows the hysteresis curve of an exemplary capacitor containing a thin film of polycrystalline SBT having a thickness of 48 nm.

FIG. 10 is a graph of 2Pr-values plotted versus electric field for four different samples of polycrystalline $SrBi_2Ta_2O_9$ having a variety of thicknesses. Changing the thickness by a factor of three changes the polarizability by less than 20%. The samples of FIG. 10 were made in 1992, shortly after discovery of the low fatigue of layered superlattice materials, and the drop in polarizability with decreased thickness is now believed to be due to the fact that the art of fabricating very thin films was not well developed in 1992. FIG. 11 shows the hysteresis curve of an exemplary capacitor containing a thin film of polycrystalline SBT having a thickness of 48 nm made by current state-of-the-art processing using a precursor containing relative amounts of metals corresponding to the stoichiometric formula $Sr_{0.9}Bi_{2.18}Ta_2O_9$. The hysteresis curve of FIG. 11 was measured at 3 volts and plotted as a graph of the polarization value, in units of $\mu C/cm^2$, as a function of applied field, in units of kV/cm. At 3 volts, the 2Pr-value, expressed in units of $\mu C/cm^2$, was about 11 $\mu C/cm^2$. FIG. 12 shows a graph of 2Pr versus film thickness for PZT, which is known in the art as the best prior art ferroelectric material for use in memories. In contrast with the polarizability of the ferroelectric layered superlattice material SBT thin films represented in FIGS. 10 and 11, it is clear that the polarizability of PZT thin films decreases dramatically as film thickness decreases. Since a polarizability greater than about 7 microcoulombs per centimeter squared ($\mu C/cm^2$) is required for a workable ferroelectric memory, it is not possible to make a workable ferroelectric memory with prior art ferroelectric materials thinner than about 150 nm. Thus, using state-of-the-art fabrication technology, it is possible to make workable ferroelectric FET memories in accordance with the invention with thin films having thicknesses much smaller than thin films of the prior art.

Another significant advantage of layered superlattice materials for the charge storage elements in a FET is the fact that they generally have dielectric constants in the range of 80 to 200. Prior ferroelectric materials, such as PZT, have dielectric constants well over 300. When a FET is made using a metal oxide on a silicon substrate, a thin film of silicon dioxide forms between the ferroelectric material and the silicon substrate. This thin film forms a parasitic capacitor of relatively low dielectric constant, i.e., about 4, in series with the ferroelectric capacitor. In other cases, such as shown in FIG. 1, a buffer or adhesive dielectric material 52, 53 is intentionally formed between the ferroelectric material and the substrate. This buffer material usually has a dielectric constant higher than 4, but less than 200. As known in the art, when a voltage is placed across a number of capacitors in series, the voltage drop across each capacitor is inversely proportional to the capacitance, which is generally proportional to the dielectric constant. Thus, when a voltage is placed on the gate electrode 58 (FIG. 1) for a FET using prior art materials such as PZT, most of the voltage drop occurs across the parasitic capacitance, or the buffer or adhesive layers. Since a layered superlattice material generally has a dielectric constant about one-third or less of that of prior art ferroelectric materials used in FETs, the voltage drop across the layered superlattice material is more than three times the voltage drop across prior art ferroelectric FETs. Likewise, a layered superlattice material lends itself to being the charge storage element in a DRAM because its dielectric constant is much higher than conventional DRAM storage element materials, such as silicon dioxide, but not so high that it becomes ineffective due to parasitic capacitances in series.

FIG. 13 shows an alternative embodiment of a ferroelectric FET memory 700. Memory 700 includes a group 720 of memory cells 703 and 707 connected in series, a read transistor 715, a set transistor 718, and a reset transistor 719. Memory cell 703 includes a ferroelectric capacitor 704 and a transistor 705, with one source-drain 701 of the transistor 705 connected to one electrode 706A of capacitor 704 and the other source-drain 702 of the transistor 705 connected to the other electrode 706B of capacitor 704. Memory cell 707 includes ferroelectric capacitor 708 connected similarly to transistor 709. One end 712 of the series group 720 is connected to the gate 713 of transistor 715, and the other end 730 is connected to the set signal line 722 through transistor 718. The node 712 is also connected to the reset signal line 724 through reset transistor 719. One source-drain 733 of transistor 715 is connected to the reset line 724, while the other source-drain 734 is connected to the bit line 726.

The memory 700 is essentially an MFM-MIS FET memory, such as shown in FIG. 8, but with two MFM sections 704 and 707 attached to FET 715. The transistors 705 and 709 short out their respective MFM section when the cell is not selected to be written to or read. While two cells 704 and 707 are shown in the embodiment of FIG. 13, the group 720 can include five, ten, or even twenty or more cells. A complete description of the function of memory 700 is provided in U.S. Provisional Patent Application Ser. No. 60/235,241 which is incorporated herein by reference as though fully disclosed herein. This type of memory based on a ferroelectric memory cell was not practically possible before the present invention and the layered superlattice material lends itself particularly well to this memory. As explained in the above-cited provisional application, this memory does not require a high polarizability material, but requires that the hysteresis curve, such as shown in FIG. 11, be very boxy. While other ferroelectric materials, such as PZT, are known to have a much higher polarizability than the layered superlattice materials, the layered superlattice materials have much more boxy hysteresis curves, and the hysteresis curves stay boxy over long periods of use; i.e., for ten years or more of constant use. In addition, the structure of the memory can most easily be implemented if the capacitors 704, 706 etc., are stacked in layers one atop the other. This structure is very practical and dense with the electronic quality thin ferroelectric films that are possible with layered superlattice materials.

A feature of the invention is that the invention leads to a very dense memory. We illustrate this feature by considering a layout of a 2×2 FeFET array for yet another possible architecture for a FeFET memory. In this architecture, a memory cell, comprises a ferroelectric FET, and a conventional transistor; hence, this architecture is referred to as a 1T/1T architecture. The FeFETs are MFMISFETs as shown in FIG. 5, and the contact structure is similar to that shown in FIG. 1, except that it does not utilize a deep well 43, but instead uses an N—Si substrate and a single P-well. As indicated above, a memory cell, comprises a ferroelectric FET, and a conventional transistor. One source-drain of the transistor is connected to the gate of the FeFET. The other source-drain of the transistor is connected to a gate line. The gate of the transistor is connected to the word line to which the signal WL0 is applied. The drain of FeFET is connected to a drain line, which in turn is connected to a read transistor. One source-drain of the read transistor is connected to drain line, while the other source-drain is connected to a drain input to which a signal DL0 is applied. The signal SE0 is applied to the gate of the transistor. The source of the FeFET is connected to the bit line to which the signal BL0 is applied. The FeFET also includes a ferroelectric layer, a floating gate, a dielectric gate insulating layer, and a channel. Cells are connected to the same gate line and bit line, while other cells are connected to another gate line, to which signal GL1 is applied, and another bit line, to which signal BL1 is applied. Each P-well, is connected to a substrate line, to which signals SB0 and SB1, are applied. The drain of the FeFET in the cell is connected to a drain line, which in turn is connected to a read transistor which has the signal SE1 applied to its gate and the signal DL1 applied to its drain input. Further details of this 1T/1T memory and its operation can be found in U.S. patent application Ser. No. 09/523,492, now U.S. Pat. No. 6,370,056 issued on Apr. 9, 2002, which is hereby incorporated by reference as though fully disclosed herein.

All of the FETs in the same byte, share the same P-well, which increases manufacturing efficiency as well as density. Preferably, the FeFETs, are n-channel and the MOSFETS, are p-channel. This permits the cell size to be minimized. Preferably, word lines, and select lines, are made of polysilicon, and are deposited and patterned at the same time. Preferably, drain lines, as well as drain input, and substrate lines, are aluminum. In the preferred embodiment, the substrate line simply comprises a connection to the P-well of the byte or row. A dielectric capping layer, preferably made of silicon glass or other material with a suitable high breakdown voltage, covers the various electrical connectors and wiring layers and insulates them from one another. The X's in a square, represent feed-throughs that provide the required connections between wiring layers at different levels. The density of the layout is higher than an NVFRAM since the extra transistor in each cell takes up less space than the capacitor of the NVFRAM. With current state-of-the-art ferroelectric technology, the density of the above layout is about the same as that of a DRAM. In principal, the density of the 1T/1T memory described herein can surpass that of the DRAM, because a conventional MOSFET, in principal, can be made smaller than a conventional DRAM capacitor.

Again, the layered superlattice material lends itself to this memory. Because very thin functional ferroelectric thin films of a layered superlattice material can be made, as compared to prior art ferroelectric materials, the ferroelectric FET takes up only about as much space as a conventional FET. If prior art materials, such as PZT, were used, the large size of the ferroelectric FET would create imbalance in the design, and the advantages of the small size of the conventional transistor would be lost.

There have been described what are at present considered to be the preferred embodiments of the invention. It will be understood that the invention can be embodied in other specific forms without departing from its spirit or essential characteristics. For example, while the invention has been described in terms of a silicon substrate, other substrates, such as gallium arsenide, germanium, silicon germanium, and other substrates may be used. Many other ferroelectric FET structures can be used. Further, now that the advantages and workability of a FET made with a layered superlattice material have been demonstrated, many other layered materials may be utilized. The present embodiments are, therefore, to be considered as illustrative and not restrictive. The scope of the invention is indicated by the appended claims.

We claim:

1. A transistor comprising a first source/drain, a second source/drain, a channel, a gate electrode, and a layered superlattice material located between said gate electrode and said channel, said layered superlattice material comprising a material having the formula

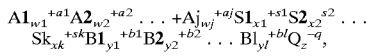

where A1, A2 ... Aj represent A-site elements in a perovskite-like structure, S1, S2 ... Sk represent superlattice generator elements, B1, B2 ... Bl represent B-site elements in a perovskite-like structure, Q represents an anion, the superscripts indicate the valences of the respective elements, the subscripts indicate the average number of atoms of the element in the unit cell, and at least w1 and y1 are non-zero.

2. A transistor as in claim 1 wherein said transistor is a ferroelectric FET and said layered superlattice material is ferroelectric.

3. An integrated circuit as in claim 2 wherein said layered superlattice material comprises strontium, bismuth, tantalum and niobium in relative molar proportions corresponding to a stoichiometric formula $Sr_aBi_b(Ta_{1-x}Nb_x)_cO_{[9+(a-1)+(b-2)(1.5)+(c-2)(2.5)]}$, where $0.8 \leq a \leq 1$, $2 \leq b \leq 2.6$, $0 \leq x \leq 0.6$ and $1.9 \leq c \leq 2.3$.

4. A method as in claim 3 wherein a=1, b=2.5, x=0.18 and c=2.2.

5. An integrated circuit as in claim 3 wherein x=0.

6. A transistor as in claim 1 wherein said layered superlattice material comprises $SrBi_2TaNbO_9$.

7. A transistor as in claim 1 further comprising an insulating layer located between said layered superlattice material and said channel.

8. A transistor as in claim 7 wherein said insulating layer comprises a metal oxide selected from the group consisting of $Ta_2O_5$, $WO_3$, $Al_2O_3$, and $TiO_2$.

9. An integrated circuit as in claim 7 wherein said insulating layer comprises $Ta_2O_5$.

10. An integrated circuit as in claim 7 wherein said insulating layer comprises a metal oxide having a stoichiometric formula $AB_2O_6$, wherein A represents at least one of strontium and barium, and B represents at least one of tantalum and niobium.

11. An integrated circuit as in claim 10 wherein said metal oxide comprises strontium tantalate having a formula $SrTa_2O_6$.

12. An integrated circuit as in claim 10 wherein said metal oxide material comprises a solid solution comprising a plurality of metal oxides, each of said metal oxides having a stoichiometric formula $AB_2O_6$, wherein A represents at least one of strontium and barium, and B represents at least one of tantalum and niobium.

13. An integrated circuit as in claim 12 wherein said plurality of metal oxides is represented by a stoichiometric formula $(Sr_xBa_{1-x})(Ta_yNb_{1-y})_2O_6$, where $0 \leq x \leq 1$ and $0 \leq y \leq 1$.

14. An integrated circuit as in claim 1 wherein said layered superlattice material is a non-ferroelectric high dielectric constant material.

15. A non-volatile ferroelectric memory comprising:
a ferroelectric memory cell comprising a ferroelectric FET including a thin film of polycrystalline layered ferroelectric superlattice material capable of existing in a first polarization state and a second polarization state, said thin film being 500 nanometers or less thick;
information write means for placing said ferroelectric memory cell in a first memory cell state or a second memory cell state depending upon information input to said memory, said first memory cell state corresponding to said ferroelectric layered superlattice material being in said first polarization state, and said second memory cell state corresponding to said ferroelectric layered superlattice material being in said second polarization state; and information read means for sensing the state of said memory cell and providing an electrical signal corresponding to said memory cell state, said layered superlattice material comprising a material having the formula

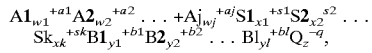
$$A1_{w1}^{+a1}A2_{w2}^{+a2}\ldots+Aj_{wj}^{+aj}S1_{x1}^{+s1}S2_{x2}^{s2}\ldots$$
$$Sk_{xk}^{+sk}B1_{y1}^{+b1}B2_{y2}^{+b2}\ldots Bl_{yl}^{+bl}Q_z^{-q},$$

where A1, A2 ... Aj represent A-site elements in a perovskite-like structure, S1, S2 ... Sk represent superlattice generator elements, B1, B2 ... Bl represent B-site elements in a perovskite-like structure, Q represents an anion, the superscripts indicate the valences of the respective elements, the subscripts indicate the average number of atoms of the element in the unit cell, and at least w1 and y1 are non-zero.

16. A ferroelectric memory as in claim 15 wherein said A-site element comprises one or more of the elements from the group comprising strontium, calcium, barium, bismuth, cadmium, and lead.

17. A ferroelectric memory as in claim 15 wherein said B-site element comprises one or more elements from the group comprising titanium, tantalum, hafnium, tungsten, niobium, and zirconium.

18. A ferroelectric memory as in claim 15 wherein said superlattice generator element comprises one or more elements from the group comprising bismuth, scandium, yttrium, lanthanum, antimony, chromium, and thallium.

19. A ferroelectric memory as in claim 15 wherein said anion comprises an element from the group comprising oxygen, chlorine, fluorine, and hybrids thereof.

20. A ferroelectric memory as in claim 15 wherein said layered superlattice material comprises strontium, bismuth, tantalum and niobium in relative molar proportions corresponding to a stoichiometric formula $Sr_aBi_b(Ta_{1-x}Nb_x)_cO_{[9+(a-1)+(b-2)(1.5)+(c-2)(2.5)]}$, where $0.8 \leq a \leq 1$, $2 \leq b \leq 2.6$, $0 \leq x \leq 0.6$ and $1.9 \leq c \leq 2.3$.

21. A ferroelectric memory as in claim 20 wherein said ferroelectric layered superlattice material comprises strontium bismuth tantalate.

22. A ferroelectric memory as in claim 20 wherein said ferroelectric layered superlattice material comprises $SrBi_2TaNbO_9$.

23. A ferroelectric memory as in claim 15 wherein said layered superlattice material comprises a solid solution of two or more materials having said formula.

24. An integrated circuit including a transistor comprising a first source/drain, a second source/drain, a channel, a gate electrode, and a polycrystalline layered superlattice material located between said first electrode channel and said gate electrode, said layered superlattice material comprising a material having the formula

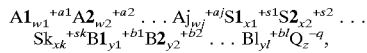
$$A1_{w1}^{+a1}A2_{w2}^{+a2}\ldots Aj_{wj}^{+aj}S1_{x1}^{+s1}S2_{x2}^{+s2}\ldots$$
$$Sk_{xk}^{+sk}B1_{y1}^{+b1}B2_{y2}^{+b2}\ldots Bl_{yl}^{+bl}Q_z^{-q},$$

where A1, A2 ... Aj represent A-site elements in a perovskite-like structure, S1, S2 ... Sk represent superlattice generator elements, B1, B2 ... Bl represent B-site elements in a perovskite-like structure, Q represents an anion, the superscripts indicate the valences of the respective elements, the subscripts indicate the average number of atoms of the element in the unit cell, and at least w1 and y1 are non-zero.

25. An integrated circuit as in claim 24 wherein said transistor is a ferroelectric FET and said integrated circuit further comprises:

information write means for placing said ferroelectric FET in a first state or a second state depending upon information input to said memory; and information read means for sensing the state of said ferroelectric FET and providing a signal corresponding to said state.

26. An integrated circuit memory as in claim 24 wherein said A-site element comprises one or more of the elements from the group comprising strontium, calcium, barium, bismuth, cadmium, and lead.

27. An integrated circuit memory as in claim 24 wherein said B-site element comprises one or more elements from the group comprising titanium, tantalum, hafnium, tungsten, niobium, and zirconium.

28. An integrated circuit memory as in claim 24 wherein said superlattice generator element comprises one or more elements from the group comprising bismuth, scandium, yttrium, lanthanum, antimony, chromium and thallium.

29. An integrated circuit memory as in claim 24 wherein said anion comprises an element from the group comprising oxygen, chlorine, fluorine, and hybrids thereof.

30. An integrated circuit memory as in claim 24 wherein said layered superlattice material comprises a solid solution of two or more materials having said formula.

31. An integrated circuit memory as in claim 25 wherein said state is a charge state.

32. An integrated circuit memory as in claim 31 wherein said layered superlattice material comprises a material having a dielectric constant greater than 50.

33. An integrated circuit memory as in claim 32 wherein said layered superlattice material comprises $BaBi_2Ta_2O_9$.

34. An integrated circuit memory as in claim 32 wherein said layered superlattice material comprises $PbBi_2Ta_2O_9$.

35. An integrated circuit memory as in claim 25 wherein said layered superlattice material comprises a material having a localized structure, within a grain or other larger or smaller unit, which localized structure contains predominately repeatable units containing one or more perovskite-like layers and one or more intermediate non-perovskite-like layers spontaneously linked in an interdependent manner.

36. A ferroelectric memory as in claim 25 wherein said layered superlattice material comprises strontium, bismuth, tantalum and niobium in relative molar proportions corresponding to a stoichiometric formula $Sr_aBi_b(Ta_{1-x}Nb_x)_cO_{[9+(a-1)+(b-2)(1.5)+(c-2)(2.5)]}$, where $0.8 \leq a \leq 1$, $2 \leq b \leq 2.6$, $0 \leq x \leq 0.6$ and $1.9 \leq c < 2.3$.

37. An integrated circuit memory as in claim 36 wherein said layered superlattice material comprises strontium bismuth tantalate.

38. An integrated circuit memory as in claim 36 wherein said layered superlattice material comprises $SrBi_2TaNbO_9$.

39. An integrated circuit device comprising:

a substrate; and a plurality of layers of material on said substrate forming a plurality of electrically interconnected electrical devices, wherein at least one of said layers of material comprises a thin film of polycrystalline layered perovskite-like material, said layered perovskite-like material comprising a material having the formula

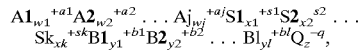
$$A1_{w1}^{+a1}A2_{w2}^{+a2}\ldots Aj_{wj}^{+aj}S1_{x1}^{+s1}S2_{x2}^{s2}\ldots$$
$$Sk_{xk}^{+sk}B1_{y1}^{+b1}B2_{y2}^{+b2}\ldots Bl_{yl}^{+bl}Q_z^{-q},$$

where A1, A2 . . . Aj represent A-site elements in a perovskite-like structure, S1, S2 . . . Sk represent superlattice generator elements, B1, B2 . . . Bl represent B-site elements in a perovskite-like structure, Q represents an anion, the superscripts indicate the valences of the respective elements, the subscripts indicate the average number of atoms of the element in the unit cell, and at least w1 and y1 are non-zero.

40. An integrated circuit device as in claim 39 wherein said thin film is 500 nm or less thick.

41. An integrated circuit as in claim 39 wherein said A-site element comprises one or more of the elements from the group comprising: strontium, calcium, barium, bismuth, cadmium, and lead.

42. An integrated circuit as in claim 39 wherein said B-site element comprises one or more elements from the group comprising: titanium, tantalum, hafnium, tungsten, niobium and zirconium.

43. An integrated circuit as in claim 39 wherein said superlattice generator element comprises one or more elements from the group comprising: bismuth, scandium, yttrium, lanthanum, antimony, chromium, and thallium.

44. An integrated circuit as in claim 39 wherein said anion comprises an element from the group comprising: oxygen, chlorine, fluorine, and hybrids thereof.

45. An integrated circuit as in claim 39 wherein said layered superlattice material comprises strontium, bismuth, tantalum and niobium in relative molar proportions corresponding to a stoichiometrc formula $Sr_aBi_b(Ta_{1-x}Nb_x)_cO_{[9+(a-1)+(b-2)(1.5)+(c-2)(2.5)]}$, where $0.85 \leq a \leq 1$, $2 \leq b \leq 2.6$, $0 \leq x \leq 0.6$ and $1.9 \leq c \leq 2.3$.

46. An integrated circuit as in claim 45 wherein said layered superlattice material comprises $SrBi_2Ta_2O_9$.

47. An integrated circuit as in claim 45 wherein said layered superlattice material comprises $SrBi_2TaNbO_9$.

48. An integrated circuit memory as In claim 39 wherein said layered superlattice material comprises $BaBi_2Ta_2O_9$.

49. An integrated circuit as in claim 39 wherein said layered superlattice material comprises $PbBi_2Ta_2O_9$.

50. An integrated circuit as in claim 39 wherein said layered superlattice material comprises a solid solution of two or more materials having said formula.

51. An integrated circuit as in claim 39 wherein said layered superlattice material comprises a material having a localized structure, within a grain or other larger or smaller unit, which localized structure contains predominately repeatable units containing one or more ferroelectric layers and one or more intermediate non-ferroelectric layers spontaneously linked in an interdependent manner.

52. An integrated circuit as in claim 39 wherein said layered superlattice material comprises a material having a localized structure, within a grain or other larger or smaller unit, which localized structure contains predominately repeatable units containing one or more perovskite-like layers and one or more intermediate non-perovskite-like layers spontaneously linked in an interdependent manner.

53. An integrated circuit as in claim 39 wherein said integrated circuit includes a memory device.

* * * * *